US 6,744,174 B2

(12) United States Patent
Paden et al.

(10) Patent No.: US 6,744,174 B2
(45) Date of Patent: Jun. 1, 2004

(54) FREQUENCY SENSITIVITY ANALYSIS AND OPTIMUM DESIGN FOR MEMS RESONATOR

(75) Inventors: Brad Paden, Santa Barbara, CA (US); Rong Liu, Goleta, CA (US); Kimberly L. Turner, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/116,415

(22) Filed: Apr. 2, 2002

(65) Prior Publication Data

US 2002/0190607 A1 Dec. 19, 2002

Related U.S. Application Data

(60) Provisional application No. 60/281,517, filed on Apr. 3, 2001.

(51) Int. Cl.[7] .................................................. H02N 2/00
(52) U.S. Cl. ........................................................ 310/309
(58) Field of Search ........................................ 310/309

(56) References Cited

U.S. PATENT DOCUMENTS

| | | | | |
|---|---|---|---|---|
| 4,479,385 A | * | 10/1984 | Koehler | 73/514.29 |
| 4,785,215 A | * | 11/1988 | Blech | 310/323.21 |
| 5,260,596 A | * | 11/1993 | Dunn et al. | 257/414 |
| 5,763,782 A | * | 6/1998 | Moore et al. | 324/207.13 |

OTHER PUBLICATIONS

M.J. Daneman et al., "Linear Microvibromotor for Positioning Optical Components," Jnl. of Microelectromechanical Sys., 5(3): 159–165 Sep. 1996.

T.B. Gabrielson, "Mechanical–Thermal Noise in Micromachined Acoustic and Vibration Sensors," IEEE Transactions on Electron Devices, 40(5): 903–909 May 1993.

Y.S. Hong et al., "A Laterally Driven Symmetric Micro–Resonator for Gyroscopic Applications," J. Micromech. Microeng., 10: 452–458 May 2000.

F.E. Miller et al., "Mechanics of Materials," International Textbook Company, Fourth Printing 4 pp Nov. 1966.

Y. Mochida et al., "Micromachined Vibrating Rate Gyroscope with Independent Beams for the Drive and Detection Modes," IEEE, 618–623 Dec. 1999.

L.A. Romero et al., "A Method for Achieving Constant Rotation Rates in a Microorthogonal Linkage System," Jnl. of Microelectromechanical Systems, 9(2): 236–244 Dec. 2000.

K.A. Shaw et al., "Scream I: A Single Mask, Single–Crystal Silicon, Reactive Ion Etching Process for Microelectromechanical Structures," Sensors and Actuators A, 40: 63–70 Jan. 1994.

J.B. Starr, "Squeeze–Film Damping in Solid–State Accelerometers," IEEE, 44–47 Sep. 1998.

(List continued on next page.)

Primary Examiner—Thomas M. Dougherty
(74) Attorney, Agent, or Firm—Gates & Cooper LLP

(57) ABSTRACT

A frequency stability analysis and design method for frequency robust resonators, such as MEMS resonators, is presented. The frequency characteristics of a laterally vibrating resonator are analyzed. With the fabrication error on the sidewall of the structure being considered, the first and second order frequency sensitivities to the fabrication error are derived. A relationship between the proof mass area and perimeter, and the beam width, is developed for single material structures, which expresses that the proof mass perimeter times the beam width should equal six times the area of the proof mass. Design examples are given for the single material and multi-layer structures. The results and principles presented in the paper can be used to analyze and design other MEMS resonators.

15 Claims, 3 Drawing Sheets-

OTHER PUBLICATIONS

W.C. Tang, "Electrostatic Comb Drive Levitation and Control Method," Jnl. of Microelectromechanical Systems, 1(4): 170–178 Dec. 1992.

F.E.H. Tay et al., "The Effects of Non–Parallel Plates in a Differential Capacitive Microaccelerometer," J. Micromech. Microeng., 9: 283–293 Jul. 1999.

J–L.A. Yeh et al., "Integrated Polysilicon and DRIE Bulk Silicon Micromachining for an Electrostatic Torsional Actuator," Jnl. of Microelectromechanical Systems, 8(4): 456–465 Dec. 1999.

Y.K. Yong et al., "Resonator Surface Contamination—A Cause of Frequency Fluctations?" IEEE Transactions on Ultrasonics, Ferroelectrics, and Frequency Control, 36(4): 452–458 Jul. 1989.

* cited by examiner

FREQUENCY SENSITIVITY ANALYSIS AND OPTIMUM DESIGN FOR MEMS RESONATOR

CROSS-REFERENCE TO RELATED APPLICATION

This application claims the benefit under 35 U.S.C. §119 (e) of the following co-pending and commonly-assigned U.S. Provisional Patent Application Serial No. 60/281,517, entitled "FREQUENCY SENSITIVITY ANALYSIS AND OPTIMUM DESIGN FOR MEMS RESONATOR," filed on Apr. 3, 2001, by Brad Paden, Rong Liu, and Kimberly L. Turner, which application is incorporated by reference herein.

STATEMENT REGARDING FEDERALLY SPONSORED RESEARCH AND DEVELOPMENT

This invention was made with Government support under Grant No. CMS-9800294, awarded by the National Science Foundation. The Government has certain tights in this invention.

BACKGROUND OF THE INVENTION

1. Field of the Invention

The present invention relates generally to frequency sensitivity analysis and optimum design for frequency robust resonators and particularly to microelectromechanical systems (MEMS) resonators.

2. Description of the Related Art (Note: This application references a number of different publications as indicated throughout the specification by reference numbers enclosed in brackets, e.g., [x]. A list of these different publications ordered according to these reference numbers can be found below in Section 5 of the specification. Each of these publications is incorporated by reference herein.)

Resonators have been widely used as a key component in MEMS devices, such as in micro-gyroscopes [1,2,3], microvibromotors [4], micro-engines [5], and microwave systems [6]. Resonators are actuated, usually electrostatically, to oscillate at their natural resonant frequency. In many cases the robustness of the design frequency to process variations is one of the most important functional properties for the resonator design. Frequency accuracy of a resonator can directly affect the quality of the system in which it serves as a component. For the lateral vibrating rate gyroscopes, the frequency matching for their two vibrating modes is important for the output sensitivity. If frequency of any one of the modes shifts, the output signal's accuracy will be decreased. Although symmetry in these gyroscopes helps the two modes to track to first order, it is useful to enhance the frequency matching by designing the resonant frequency to be insensitive to process variations.

In microvibromotors, several resonators impact a bar to make it move in the plane of the chip. If the impacting frequencies of the resonators are not harmonic, the motion of the bar will be unpredictable. Similarly, two orthogonal resonators actuate the previously mentioned micro-engine. The rotational stability of the engine is affected by the synchrony of these two resonators. Finally, in microwave systems, the resonator is used as an IF or RF filter. Therefore, the frequency accuracy of the resonator in this application is particularly important as its frequency determines the system performance in a fundamental way.

Several factors affect the stability of the resonator frequency, which include mass-loading [7], Brownian force [8] and fabrication variations [9]. The mass-loading that is the instantaneous differences in the rate of adsorption and desorption of contaminant molecules to and from the resonator surface causes mass fluctuation, which in turn leads to frequency fluctuation. Yong and Vig have given the mathematical expression to quantify the mass-loading effects on phase noise. A Brownian force is produced by the impingement of gas/air molecules on the structure, which Gabrielson has studied theoretically. Although it was known that the fabrication errors affect the frequency stability [11], fewer researchers have focused on this study because of the structure complexity and differences in micromachining methods.

With present micromachining techniques, the fabrication process variation in MEMS is inevitable and it will continue to be the case when devices are miniaturized to the point of process limitations. For example, the fabrication tolerance for the width of a typical suspension beam is reported to be about 10% in [10]. Even the same fabrication errors will cause different frequency variations for different resonator structures. There is a need in the art for design and fabrication processes that optimize the structure, tolerances and performance of MEMS resonators.

The present invention meets these needs.

SUMMARY OF THE INVENTION

The present invention comprises a frequency robust resonator including at least one beam having a first end, a second end, and a beam width and a proof mass having a proof mass area and a perimeter wherein the proof mass is affixed to the first end of the beam and the second end of the beam is affixed to a ground and the proof mass perimeter multiplied by the beam width is substantially equivalent to six times the proof mass area.

This invention applies to any resonant structure whose resonant frequency depends on a number of design parameters, one of which, is relatively uncertain. Let $\omega(p_0, p_1, p_2, \ldots, p_n)$ be a resonant frequency of a structure and $p_0, p_1, p_2, \ldots, p$ be dimensional, material and other parameters. Without loss of generality, assume $p_0$ is the parameter subject to manufacturing variations. The invention is to constrain the design parameters such that $$\frac{\partial}{\partial p_0} \omega(p_0, p_1, p_2, \ldots, p_n) = 0$$

so that the resonant frequency is insensitive, to first order, to manufacturing variations. Designs meeting this constraint are "frequency robust" resonators. The invention applies to vibrating structures of all shapes and boundary conditions. For example, in addition to MEMS resonators, the invention applies to the design of bell, chimes, and other resonating structures.

In this invention, the frequency robustness for a folded-beam lateral vibrating resonator is analyzed. Based on the analysis, an optimum design method is presented for the resonator to obtain minimum frequency sensitivity. A simple relationship between the area and the perimeter of proof mass, and the beam width is derived for single material structures.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

Figure 1:
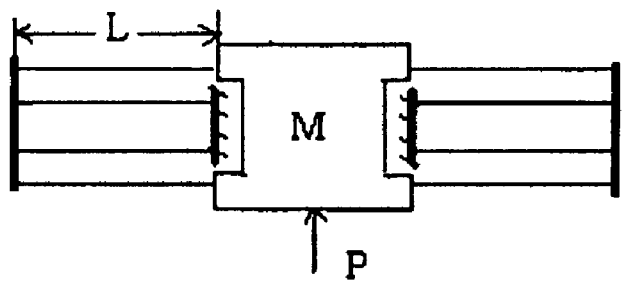
FIG. 1 illustrates a folded-beam suspended resonator.

1. Analysis of a Folded-Beam Suspended Resonator with Single Structural Material FIG. 1 shows a typical folded-beam suspended resonator where the cross-section of the beams is assumed to be rectangular. The merits of this kind of resonator include a wide frequency separation between the desired mode of oscillation and higher-frequency parasitic modes, and a smaller size than cantilevered beam resonators.

One objective of this invention is to derive a simple relationship between the design parameters to ensure low sensitivity to photo- and etch-induced variations in linewidth. Foundationally, a development of beam equations for MEMS resonators is shown in Appendix B.

The lateral spring constant of the eight combined folded beams is given by $$k = \frac{2a^3 bE}{L^3} \quad (1)$$

where a and b are the width and thickness of the beams respectively, L is the length of the each beam and E is the modulus of elasticity of the beam material. The natural frequency of the resonator can be expressed as $$\omega_0 = \sqrt{\frac{k}{M_{eff}}} = \sqrt{\frac{2a^3 bE}{M_{eff} L^3}} \quad (2)$$

where, $M_{eff}$ is the effective mass including the proof mass and an equivalent mass contributed by the folded-beam. Assuming that the thickness of the mass (in the dimension normal to the chip) is the same as that of the beams and that the structure consists of only one material, $$M_{eff} = \rho b A_{eff} = \rho b (A + 8 \mu L a) \quad (3)$$

where $A_{eff}$ is the effective area; $\rho$ is the density of the material, A is the area of the proof mass excluding cut-outs etc., $\mu$ is the mass equivalence coefficient (0.38 for folded-beam [6]). Presently, most proof masses are rectangular plates with attached comb-drive fingers and are solid or trussed.

Substituting (3) into (2) yields the natural frequency of the resonator $$\omega_0 = \sqrt{\frac{2a^3 E}{\rho A_{eff} L^3}} \quad (4)$$

In computing (4), b is cancelled because it appears both in the numerator and in the denominator. This shows that when the thickness of beam is the same as that of the moving mass the natural frequency of the system is independent of the thickness.

Hence it is reasonable to assume that the fabrication error is only on the "sidewalls" of the structure, i.e. there is a small uniform width error $\delta$ in the lateral dimensions of folded-beam and proof mass. (It is shown in Appendix A that our results hold for arbitrary "sidewall" errors.) Then the natural resonant frequency becomes $$\omega_0(\delta) = \sqrt{\frac{2(a+2\delta)^3 E}{\rho A_{eff}(\delta) L^3}} \quad (5)$$

where $A_{eff}(\delta) = A(\delta) + 8 \mu L (a+2\delta)$, and the approximation $\delta \ll L$ is used to simplify the influence of $\delta$ on the length of the beams.

Therefore the first order sensitivity of $\omega_0$ with respect to $\delta$ is given as $$\frac{\partial \omega_0}{\partial \delta} = 3\sqrt{\frac{2(a+2\delta)E}{\rho A_{eff}(\delta) L^3}} - \frac{1}{2}\sqrt{\frac{2(a+2\delta)^3 E}{\rho A_{eff}(\delta)^3 L^3}} \frac{\partial A_{eff}(\delta)}{\partial \delta} \quad (6)$$

It is easily observed that the derivative of any area A with respect to the sidewall fabrication error $\delta$ is directly proportional to the perimeter of area in question including the perimeter of enclosed holes and voids. That is, $$\frac{\partial A_{eff}(\delta)}{\partial \delta} = P_{eff}(\delta) = P(\delta) + 16 \mu L \quad (7)$$

where $P(\delta)$ is the perimeter of the proof mass.

Substituting (7) into (6) yields $$\frac{\partial \omega_0}{\partial \delta} = \left(3 - \frac{(a+2\delta)[P(\delta) + 16 \mu L]}{2 A_{eff}(\delta)}\right)\sqrt{\frac{2(a+2\delta)E}{\rho A_{eff}(\delta) L^3}} \quad (8)$$

The second order sensitivity of with respect to can be derived as $$\frac{\partial^2 \omega_0}{\partial \delta^2} = \left(3 - \frac{3 P_{eff}(\delta)(a+2\delta)}{A_{eff}(\delta)} - \frac{4(a+2\delta)^2}{A_{eff}(\delta)} + \frac{3(P_{eff}(\delta))^2 (a+2\delta)^2}{4(A_{eff}(\delta))^2}\right) \times$$

$$\sqrt{\frac{2E}{(a+2\delta)\rho A_{eff}(\delta) L^3}} \quad (9)$$

To set $$\frac{\partial \omega_0}{\partial \delta} \text{ and } \frac{\partial^2 \omega_0}{\partial \delta^2}$$

equal zero, the following conditions must be satisfied $$\left.\frac{\partial \omega_0}{\partial \delta}\right|_\delta = 3A_{\textit{eff}}(\delta) - \frac{1}{2}P_{\textit{eff}}(\delta)(a+2\delta) = 0 \qquad (10)$$

$$\left.\frac{\partial \omega_0}{\partial \delta}\right|_\delta = 3\left[A_{\textit{eff}}(\delta) - \frac{1}{2}P_{\textit{eff}}(\delta)(a+2\delta)\right]^2 + 4A_{\textit{eff}}(\delta)(a+2\delta)^2 \qquad (11)$$
$$= 0$$

Setting $\delta$ equal zero, and substituting (6) and (7) into (10) and (11) yields $$\left.\frac{\partial \omega_0}{\partial \delta^2}\right|_{\delta=0} = 3A - \frac{1}{2}Pa + 16\mu La = 0 \qquad (12)$$

$$\left.\frac{\partial^2 \omega_0}{\partial \delta^2}\right|_{\delta=0} = 3\left[A - \frac{1}{2}Pa\right]^2 - 4(A+8\mu La)a^2 = 0 \qquad (13)$$

If the parameters of the structure are designed to satisfy (12) or, better yet, both (12) and (13), the frequency variation due to process variations can be reduced significantly.

However, it is not usually the case that both (12) and (13) can be satisfied, as substituting (12) into (13) yields $$3A + 24\mu La = a^2 \qquad (14)$$

$$\frac{1}{2}P + 8\mu L = a \qquad (15)$$

Generally, the width of the beam is small, and to satisfy both (14) and (15) the area and perimeter of the proof mass have to be less than $a^2$ and 2 a respectively, which is unreasonable for most MEMS resonators. Therefore, only the first order sensitivity of $\omega_0$ with respect to $\delta$ can be designed to be zero in most cases. When the area of the proof mass is much larger than the area of the beam, (12) reduces to a convenient rule of thumb: the perimeter of the proof mass times the beam width should be roughly six times the area of the proof mass, i.e. Pa≈6A.

2. Analysis for Multi-Layer Structures

Figure 2:
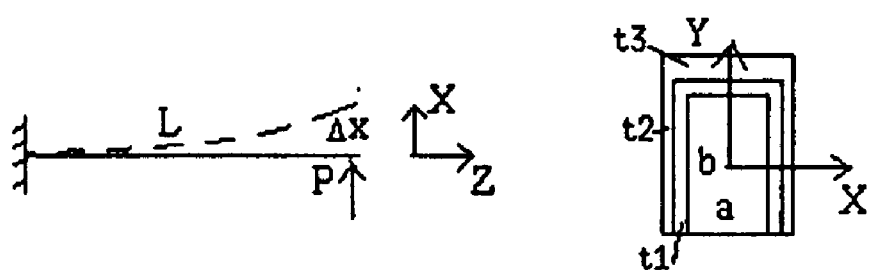
FIG. 2 illustrates a folded-beam resonator coated with two material layers.

FIG. 2 shows a typical MEMS resonator coated with two material layers. For the sake of electrical conductivity, beams and proof masses in MEMS resonators ate usually coated with two material layers—one oxide layer with thickness $t_1$ and one metal layer with side-thickness $t_2$ and top-thickness $t_3$.

The moment of the inertia of the oxide layer and metal layer are given respectively by $$I_{c1} = \frac{(a+2t_1)^3(b+t_1) - a^3b}{12} \qquad (16)$$

$$I_{c2} = \frac{(a+2(t_1+t_2))^3(b+t_1+t_3) - (a+2t_1)^3(b+t_1)}{12} \qquad (17)$$

Because the coat-layers and the innermost silicon beam have the same lateral deflection on the tip of the beam, the following expression can be given as $$\Delta X = \frac{P_1 L^3}{3E_{c1}I_{c1}} = \frac{P_2 L^3}{3E_{c2}I_{c2}} = \frac{4P_3 L^3}{Ea^3 b} \qquad (18)$$

-continued
$$= \frac{4PL^3}{E_{c2}(a+2(t_1+t_2))^3(b+t_1+t_3) - (E_{c2}-E_{c1})(a+2t_1)^3(b+t_1) - (E_{c1}-E)a^3 b}$$

where P is overall force on the tip of the beam; $P_1$, $P_2$, $P_3$ are the forces of P on the oxide layer, metal layer and silicon beam respectively. $E_{c1}$, $E_{c2}$ and E are the Young's modulus' for three materials.

Defining the effective beam width, effective beam thickness and effective Young's modulus' respectively as $$a_{\textit{eff}} = (a+2(t_1+t_2))$$
$$b_{\textit{eff}} = (b+t_1+t_3) \qquad (19)$$

$$E_{\textit{eff}} = E_{c2} - \frac{(E_{c2}-E_{c1})(a+2t_1)^3(b+t_1)}{(a+2(t_1+t_2))^3(b+t_1+t_3)} - \frac{(E_{c1}-E)a^3 b}{(a+2(t_1+t_2))^3(b+t_1+t_3)}$$

(18) becomes $$\Delta X = \frac{4PL^3}{E_{\textit{eff}} a_{\textit{eff}}^3 b_{\textit{eff}}} \qquad (20)$$

If the fabrication errors occur only on innermost beam, e.g. a becomes a+2$\delta$, then the sensitivity of effective elastic modulus can be simply expressed as $$\frac{\partial E_{\textit{eff}}}{\partial \delta} = \frac{-12(E_{c2}-E_{c1})(a+2\delta+2t_1)^2(b+t_1)t_2 - 12(E_{c1}-E)(a+2\delta)^2 b(t_1+t_2)}{(a+2\delta+2(t_1+t_2))^4(b+t_1+t_3)} \qquad (21)$$

If the $t_1$ and $t_2$ ate much smaller than the width of the beam, it can be assumed that the effective Young's modulus remains constant in the frequency sensitivity analysis. In this case, the first and second sensitivities to the fabrication errors are similar to resonators that are not coated.

When there are fabrication errors in the lateral dimension of the layered materials, the effective modulus of elasticity will change too. The computation of sensitivities is straightforward for those skilled in the art using computational algebra software such as Mathematica or Matlab.

Besides the above deformation equations, the mass of the proof mass will also have different expressions than that for a single material structure. The expression is dependent on construction, trussed or solid, of the proof mass, and will be given in the following section.

3. Example of a Robust Design
3.1 Single Material Structure

Figure 3:
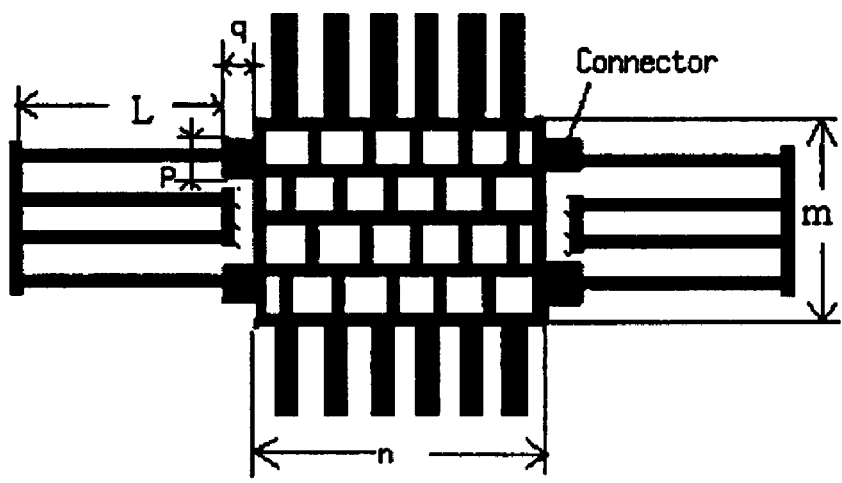
FIG. 3 illustrates a typical folded-beam suspended comb driven resonator.

FIG. 3 illustrates a typical folded-beam suspended comb driven resonator. L is the length of each beam, proof mass width m comprises M+2 row walls and length n comprises N+2 column walls The trussed comb-driven mass is suspended by two symmetric folded-beams. The trussed structure for the mass simplifies the under-releasing of the structure from the substrate in, say, the SCREAM process [12]. Also, in some designs, it is useful that the truss decreases the squeeze-film damping when there is a vertical vibration [11].

The proof mass is divided by row and column walls into smaller squares of dimension (k×k), except for the rightmost or leftmost sub-regions which are rectangles of dimension k/2×k. The width of all the walls in the trussed proof mass is t; the number of row and column walls on the proof mass not including the outside walls are M and N respectively; the width and length of the comb fingers is d and g respectively, and the number of comb fingers on each side is $n_f$. The four connectors that connect the folded beams to the proof mass are solid rectangles with width p and length q.

The design task is to specify the above parameters in addition to the folded-beam parameters L and a, and the structure thickness b, so that the natural resonant frequency of the structure equals $\omega_0$ and its first order sensitivity to sidewall fabrication error is zero.

The dimension of the inner square satisfies $$k = \frac{n-(N+2)t}{N+1/2} = \frac{m-(M+2)t}{M+1} \tag{22}$$

The solid area on the proof mass can be expressed as $$A = 2n_f dg + 4pq + nm - [n-(N+2)t][m-(M+2)t] \tag{23}$$

where, $2n_f dg$ is the area of the comb finger;

$4pq$ is the area of four connectors;

$nm$ is the overall area of rectangular proof mass;

$[n-(N+2)t][m-(M+2)t]$ is the total area of all inner trussed squares.

The overall perimeter of the proof mass is given by $$P = 4n_f g + 4(2q-a) + 2(n+m) + 2(M+1)[n-(N+2)t] + 2(N+1)[m-(M+2)t] \tag{24}$$

Substituting (23) and (24) into (4), (12) and (13) yields a set of equations (the algebra is omitted as it is straightforward). These equations plus (22) can be regarded as constraint conditions for solving for the structural parameters. The number of parameters is much larger than the number of the equations, so that these equations are underdefined and there is some design freedom.

Practically, the parameters L and m can be initially given based on overall dimensional requirement of the whole device. The width p and length q of the connectors can also be given as a function of folded beam width. According to the designed electrostatic force, the size of the comb finger can be determined, which include d, $n_f$ and g. Since the total width of the fingers and gaps can not exceed the width of the device, a constraint condition has to be added as $$2n_f d < m \tag{25}$$

The dimension t can be initially given. After the above 8 parameters (L, m, t, d, $n_f$, g, p, q) are determined, there are still four parameters (a, n, M, N) to be resolved with equations (4), (12), (13) and (14).

Rather than going through a complete design process involving detailed electrostatic design etc., these eight parameters are set to typical values found in the literature:

$L$=500 $\mu$m, $m$=350 $\mu$m $p$=8 $\mu$m, $q$=10 $\mu$m $t$=1 $\mu$m $n_f$=30, $d$=4 $\mu$m, $g$=30 $\mu$m \hfill (26)

The material constants are chosen as those for silicon $\rho$=2330 kg/m$^3$, $E$=190 GPa \hfill (27)

The natural frequency of the resonator is selected to be 55 kHz, which is in the range of typical MEMS resonator frequencies. So the angular frequency is $\omega_0$=2$\pi$×5500=34557.519(rad/sec) \hfill (28)

From (4), (14) and (15), the beam width for first and second order insensitivity can be initially calculated to be $$a = \frac{\omega_0^2 L^3 \rho}{6E} = 3.05 \times 10^{-4} \ \mu\text{m} \tag{29}$$

which is too small for current MEMS fabrication technologies. Even though the width can be increased by increasing the beam length and natural frequency, the increase is limited and not sufficient to make the width consistent with current fabrication methods. Therefore, as mentioned previously, satisfying both the first and second order sensitivity conditions is almost impossible. When only the first condition is considered, the width of the folded beam can be set to 4 $\mu$m. Hence the solid area and perimeter can be calculated by solving (4) and (12)

$$A = \frac{2a^3 E}{\omega_0^2 L^3 \rho} - 8\mu La = 6.38418 \times 10^4 \ \mu\text{m}^2 \tag{30}$$

$$P = \frac{12 a^3 E}{\omega_0^2 L^3 \rho} - 16\mu La = 1.01843 \times 10^5 \ \mu\text{m}^2 \tag{31}$$

Now that the required area and perimeter of the proof mass are determined, solving (16), (17) and (18) with respect to variables m, M and N yields $n$=391.739 $\mu$m $N$=79.5717

$M$=88.7765 \hfill (32)

Because both N and M must be integers, the N and M in (26) are rounded to 80 and 89 respectively. Then t, l and m should be adjusted to satisfy (16), (17) and (18), $t$=0.999112 $\mu$m $n$=390.296 $\mu$m $m$=349.703 $\mu$m \hfill (33)

From (16), the width of the inner square can be calculated as $$k = \frac{n-(N+2)t}{(N+1/2)} = 3.32641 \ \mu\text{m} \tag{34}$$

3.2 Multi-layer Structure

In this subsection, we outline the design of a multi-layer structure. The design steps are similar to the single material design except for different expressions of design conditions.

The top-view of the multi-layer structure is the same as FIG. 3. From (20), the lateral spring constant of the folded beams is given by $$k_{eff} = \frac{2a_{eff}^3 b_{eff} E_{eff}}{L^3} \tag{35}$$

The natural frequency of the resonator can be expressed as $$\omega_0 = \sqrt{\frac{k_{eff}}{M_{eff}}} = \sqrt{\frac{2a_{eff}^3 b_{eff} E_{eff}}{M_{eff} L^3}} \qquad (36)$$

where $M_{eff}$ is the effective mass comprising the mass of the proof mass $M_{proof}$ plus an equivalent mass due to the folded-beam $M_{beam}$ $$M_{eff} = M_{proof} + \mu M_{beam} \qquad (37)$$

From the construction, the mass $M_{proof}$ and $M_{beam}$ can be expressed respectively as $$\begin{aligned}M_{proof} = {}& 4q\{pb\rho + t_1(2b+p+2t_1)\rho_1 + \\ & [2t_2(b+t_1)+t_3(p+2(t_1+t_2))]\rho_2\} + \\ & 2n_f g\{db\rho + t_1(2b+d+2t_1)\rho_1 + \\ & [2t_2(b+t_1)+t_3(d+2(t_1+t_2))]\rho_2\} + \\ & \{2m+N[m-(M+2)(t+2(t_1+t_2))] + \\ & (M+2)[n-2(t+2(t_1+t_2))]\} \times \\ & \{tb\rho + t_1(2b+t+2t_1)\rho_1 + \\ & [2t_2(b+t_1)+t_3(t+2(t_1+t_2))]\rho_2\}\end{aligned} \qquad (38)$$

$$\begin{aligned}M_{beam} = {}& 8L\{ab\rho + t_1(2b+a+2t_1)\rho_1 + \\ & [2t_2(b+t_1)+t_3(a+2(t_1+t_2))]\rho_2\}\end{aligned}$$

The fabrication error here is assumed to occur only on the sidewalls of the innermost structure, i.e. there is a small width error $\delta$ in the lateral dimension of all innermost components of the folded-beam and proof mass. There are no errors in the thickness. Then the natural resonant frequency becomes $$\omega_0(\delta) = \sqrt{\frac{2(a_{eff}+2\delta)^3 b_{eff} E_{eff}(\delta)}{M_{eff}(\delta) L^3}} \qquad (39)$$

Therefore the first order sensitivity of $\omega_0$ with respect to $\delta$ can be given as $$\begin{aligned}\frac{\partial \omega_0}{\partial \delta} = {}& 3\sqrt{\frac{2(a_{eff}+2\delta) b_{eff} E_{eff}(\delta)}{M_{eff}(\delta) L^3}} + \\ & \frac{1}{2}\sqrt{\frac{2(a_{eff}+2\delta)^3 b_{eff}}{E_{eff}(\delta) M_{eff}(\delta) L^3}}\frac{\partial E_{eff}(\delta)}{\partial \delta} - \\ & \frac{1}{2}\sqrt{\frac{2(a_{eff}+2\delta)^3 b_{eff} E_{eff}(\delta)}{M_{eff}(\delta) L^3}}\frac{\partial M_{eff}(\delta)}{\partial \delta}\end{aligned} \qquad (40)$$

where the $\left.\frac{\partial M_{eff}(\delta)}{\partial \delta}\right|_{\delta=0}$ can be expressed as $$\begin{aligned}\left.\frac{\partial M_{eff}(\delta)}{\partial \delta}\right|_{\delta=0} = {}& \{8q + 4n_f g + 2[(N+2)m + (M+2)n - \\ & (N+2)(M+2)(t+2(t_1+t_2))] - \\ & 16\mu L\}\{b\rho + t_1\rho_1 + t_3\rho_2\} + \\ & 2[M+N+4-(N+2)(M+2)] \times \\ & \{tb\rho + t_1(2b+t+2t_1)\rho_1 + \\ & [2t_2(b+t_1)+t_3(t+2(t_1+t_2))]\rho_2\}\end{aligned} \qquad (41)$$

So setting $\left.\frac{\partial \omega_0}{\partial \delta}\right|_{\delta=0} = 0$ yields $$3M_{eff} E_{eff} + \frac{M_{eff} a_{eff}}{2}\left.\frac{\partial E_{eff}(\delta)}{\partial \delta}\right|_{\delta=0} - \frac{E_{eff} a_{eff}}{2}\left.\frac{\partial M_{eff}(\delta)}{\partial \delta}\right|_{\delta=0} = 0 \qquad (42)$$

From (21), $\left.\frac{\partial E_{eff}(\delta)}{\partial \delta}\right|_{\delta=0}$ can be expressed as $$\left.\frac{\partial E_{eff}}{\partial \delta}\right|_{\delta=0} = \frac{-12(E_{c2}-E_{c1})(a+2t_1)^2(b+t_1)t_2 - 12(E_{c1}-E)a^2 b(t_1+t_2)}{a_{eff}^4 b_{eff}} \qquad (43)$$

On the proof mass, the inner square condition becomes $$\frac{n-(N+2)(t+2(t_1+t_2))}{N+1/2} = \frac{m-(M+2)(t+2(t_1+t_2))}{M+1} = k \qquad (44)$$

From the above analysis, when the multi-layer structure resonator is designed, three constraint conditions, (36), (42) and (44), should be satisfied. The design processes are similar to those of the single material structure resonator. Most of the design parameters are determined empirically based on process induced design rules. Only three variables are left to solve with the above three equations (36), (42) and (44).

In the case of multi-layer structures, if other fabrication errors, such as thickness errors and coated-layer fabrication errors, are considered, the analysis and design methods ate similar to above analysis. With these fabrication errors being considered, the natural vibrating frequency of the designed resonator will be robust.

In this invention, the frequency sensitivity characteristics of micro-resonators are analyzed, and a method to make the frequency robust to fabrication error of line width variation is presented. A generalization to arbitrary sidewall shape variation is included in Appendix A.

For a resonator fabricated with only one material, the first and second order sensitivities of frequency to the Sine-width fabrication error were derived. With the assumption of the beam and proof mass having the same thickness, the natural frequency is independent of the thickness, so that the thickness fabrication error can be ignored when considering the frequency sensitivity.

When both the first and second order sensitivities are set to be satisfied at the same time, the results will make the design unreasonable (excessively wide beam and excessively small proof mass). Therefore only the first order sensitivity is considered in the design example. A rule of thumb for robust resonator design is that the proof mass perimeter times the beam width should be six times the area of the proof mass.

For the multi-layer structure, the effective modulus of elasticity and mass are given, and the first order frequency sensitivity to the sidewall fabrication error of the innermost beam is derived. The results can be used to analyze the effect of other fabrication errors on the structure.

The concepts presented here can be applied to more complex systems using numerical optimization or computer algebra software such as Mathematica or Matlab.

4. Conclusion

This concludes the description of one or more embodiments of the invention. In summary, the present invention discloses a frequency robust resonator comprising at least one beam having a first end, a second end, and a beam width and a proof mass having a proof mass area and a perimeter, wherein the proof mass is affixed to the first end of the beam and the second end of the beam is affixed to a ground and the proof mass perimeter multiplied by the beam width is substantially equivalent to six times the proof mass area.

The foregoing description of one or more embodiments of the invention has been presented for the purposes of illustration and description. It is not intended to be exhaustive or to limit the invention to the precise form disclosed. Many modifications and variations are possible in light of the above teaching. For example, high-frequency resonators may not have distinct inertial and compliant structures as does the folded beam resonator. Such structures, rather, have distributed mass and compliances. Nonetheless, the principles of our invention apply. It is intended that the scope of the invention be limited not by this detailed description, but rather by the claims appended hereto.

5. References

The following references are incorporated by reference herein:

[1] W. C. Tang, M. G. Lir and R. T. Howe, "Electrostatic Comb Drive Levitation and Control Method", Journal of Microelectromechanical System, Vol.1, No.4, December 1992, pp170–178.

[2] Y. Mochida, M. Tamura and K. Ohwada, "A Micromachined Vibrating Rate Gyroscope with Independent Beams for the Drive and Detection Modes", IEEE International conference on MEMS'99, in Technical Digest, 1999, pp618–623.

[3] L. A. Yeh, Hjiang and N. C. Tien, "Integrated Polysilicon and DRIE Bulk Silicon Micromachining for an Electrostatic Torsional Actuator", Journal of Microelectromechanical System, Vol.8, No.4, December 1999, pp456–465.

[4] M. J. Daneman, N. C. Tien, O. Solgaard, A. P. Pisano, K. Y. Lau and R. S. Muller, "Linear Microvibromotor for Positioning Optical Components", Journal of Microelectromechanical System, Vol.5, No.3, September 1996, pp159–165.

[5] L. A. Romero, F. M. Dickey and S. C. Holswade, "A Method for Achieving Constant rotation Rates in a Microorthogonal Linkage System", Journal of Microelectromechanical System, Vol.9, No.2, June 2000, pp236–244.

[6] Hector J. De Los Santos, <Introduction to Microelectromechanical (MEM) Microwave System>, Artech House, 1999.

[7] Y. K. Yong and J. R. Vig, "Resonator Surface Contamination—A Cause of Frequency Fluctuation?", IEEE Trans. On Ultrasonic, Ferroelectrics, and Frequency Control, Vol.36, No.4, July 1989, pp452–458.

[8] T. B. Gabrielson, "Mechanical—Thermal Noise in Micromachined Acoustic and Vibration Sensors", IEEE Trans. On Electron Device, Vol.40, No.5, May 1993, pp903–909.

[9] F. E. H. Tay, J. Xu, Y. C. Liang, V. J. Logeeswaran and Y. F. Yao, "The effects of non-parallel plates in a differential capacitive microaccelerometer", Journal of Micromech. and Microeng., 9(1999),pp283–293.

[10] Y. S. Hong, J. H. Lee and S. H. Kim, "A laterally driven symmetric micro-resonator for gyroscopic applications", Journal of Micromech. and Microeng., 10(2000),pp452–458.

[11] J. B. Starr, "Squeeze-film Damping in Solid-State Accelerometers", in Solid-state Sensor and Actuator Workshop, Tech. Dig., New York, 1990, pp44–47.

[12] K. A. Shaw, Z. L. Zhang, and N. C. MacDonald, "SCREAM-I, a single-mask single-crystal silicon, reactive ion etching process for microelectromechanical structures", Sensors and Actuators A, 40:63, 1994.

Appendix A

Figure 4:
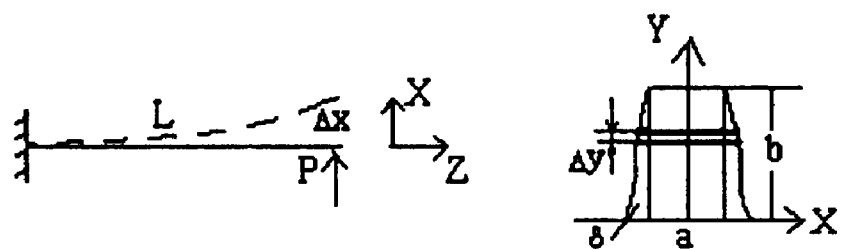
FIG. 4 illustrates a cantilever beam and its cross sections.

6. Equations for MEMS Resonator with Arbitrary Profile of Sidewall Fabrication Error FIG. 4 illustrates the cross-section of the beam. A thin segment of thickness $\Delta y$ is considered. If $\Delta y$ is small enough, this segment can be regarded as a rectangle in the dimension of $b \times (a+2\delta_i)$. $\delta_i$ is the fabrication error on the segment, and is dependent on the position of the segment on the cross-section. This segment with length of L is a thin beam. The tip deflection of this thin beam can be expressed as $$\Delta X_i = \frac{4P_i L^3}{E[a+2\delta_i]^3 \Delta y} \quad (A-1)$$

where the $P_i$ is the force on the tip of this thin beam.

The whole beam can be divided into many thin beams as above. Because the overall force on the tip of the beam $$P = \sum_i P_i,$$

and any tip deflection of those thin beams is equal to tip deflection of the whole beam, i.e. $\Delta X = \Delta X_i$, the deformation equation of the whole beam can be given as $$\Delta X = \frac{4PL^3}{E \int_0^b [a+2\delta(y)]^3 dy} \quad (A-2)$$

Then the elastic coefficient of the beam can be obtained as $$k = \frac{E \int_0^b [a+2\delta(y)]^3 dy}{4L^3} \quad (A-3)$$

The mass of a unit length of beam can be expressed as $$M_{unit} = \rho \int_0^b [a+2\delta(y)] dy \quad (A-4)$$

$$\rho b(a+2\delta_{mean})$$

where $$\delta_{mean} = \frac{\int_0^b \delta(y) dy}{b}$$

is the mean fabrication error on one side of the beam. Equation (A-4) has the same form as that for a beam with line-width fabrication error, except the constant $\delta$ for with line-width fabrication error beam is replaced with $\delta_{mean}$. So the mass of the proof mass can be obtained similarly as $\delta_{mean}$ is considered as the mean fabrication error on the width of all structures.

$$M = \rho b A(\delta_{mean}) \quad (A-5)$$

where $A(\delta_{mean})$ is the area of the proof mass with fabrication error.

The natural frequency of the folded beam suspended resonator can be given as $$\omega_0 = \sqrt{\frac{2E\int_0^b [a+2\delta(y)]^3 dy}{b\rho A(\delta_{mean})L^3}}$$

$$= \sqrt{\frac{2Eb(a+2\delta_{mean})^3 + 2E\left[12a\left(\int_0^b \delta(y)^2 dy - \delta_{mean}^2 b\right) + 8\left(\int_0^b \delta(y)^3 dy - \delta_{mean}^3 b\right)\right]}{b\rho A(\delta_{mean})L^3}} \quad (A\text{-}6)$$

Because the following equations are satisfied $$2E\left[12a\left(\int_0^b \delta(y)^2 dy - \delta_{mean}^2 b\right) + 8\left(\int_0^b \delta(y)^3 dy - \delta_{mean}^3 b\right)\right]\bigg|_{\delta=0} = 0 \quad (A\text{-}7)$$

$$\frac{\partial\left[2E\left[12a\left(\int_0^b \delta(y)^2 dy - \delta_{mean}^2 b\right) + 8\left(\int_0^b \delta(y)^3 dy - \delta_{mean}^3 b\right)\right]\right]}{\partial \delta_{mean}}\bigg|_{\delta=0} = 0 \quad (A\text{-}8)$$

the first sensitivity of the natural frequency to the mean fabrication error can be expressed as $$\frac{\partial \omega_0}{\partial \delta_{mean}}\bigg|_{\delta=0} = \quad (A\text{-}9)$$

$$3\sqrt{\frac{2(a+2\delta_{mean})E}{\rho A(\delta_{mean})L^3}} - \frac{1}{2}\sqrt{\frac{2(a+2\delta_{mean})^3 E}{\rho A(\delta_{mean})^3 L^3}} \frac{\partial A(\delta_{mean})}{\partial \delta_{mean}}\bigg|_{\delta_{mean}=0}$$

From (A-9), same results can be obtained as in (12) with $\delta$ in (12) replaced by $\delta_{mean}$.

Appendix B

7. Beam Equation on MEMS Resonator

Beams on MEMS resonator are used as suspensions for the moving mass. When the mass is resonating, its suspension beams will transform elastically. There are generally two kinds of resonation: torsional and lateral. In the following, the static transformation equations for those two kinds of resonation will be derived; then some mechanical properties of the beams will be discussed.

The transverse section of the beam discussed below is assumed to be rectangle with width a and thickness b (b>a). For other cross-sections, only the moments of inertia or polar moment of inertia need to be changed.

7.1 Torsional Motion Beam

Figure 5A:
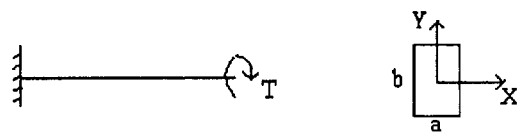
FIGS. 5A–5E illustrate beam equations for torsional and lateral resonation.

From Saint-Venant's theory, the angle of twist for a beam with rectangular section as in FIG. 5A can be expressed as $$\theta = \frac{TL}{\beta a^3 bG} \quad (B\text{-}1)$$

where, T is the torque loaded on the end of the beam; L is the length of the beam; a and b are the length of short and long sides of the rectangle; G is the shearing modulus of elasticity; $\beta$ is the numerical factor which is dependent on the aspect ratio of the rectangle, ranging from 0.15 to 0.34

$$\beta \cong \frac{1}{3}\left(1 - \frac{192a}{\pi^5 b}\tanh\left(\frac{\pi b}{2a}\right)\right) \quad (B\text{-}1\text{-}1)$$

From (B-1), the torsional elasticity of the beam can be obtained $$k_\tau = \frac{T}{\theta} = \frac{\beta a^3 bG}{L} \quad (B\text{-}2)$$

The natural frequency of the beam and moving mass system is $$\omega_0 = \sqrt{\frac{k_\tau}{J}} \quad (B\text{-}3)$$

where the J is the moment of inertia of the system on Z axis, which is consisted of two parts. One is the moment of inertia of the beam itself $$J_1 = \frac{1}{12}M(a^2 + b^2) \quad (B\text{-}4)$$

where M is the mass of the beam. The other part $J_2$ is the moment of inertia of those movable parts connected to the beam, such as comb fingers, trussed cantilevered beam, and is independent on the size of the beam. Generally, the $J_2$ is much bigger than the $J_1$, so that the $J_1$ can be negligible on practical calculation.

Substituting the (2) into (3) yields $$\omega_0 = \sqrt{\frac{\beta a^3 bG}{(J_1 + J_2)L}} \quad (B\text{-}5)$$

Partially differentiating the $\omega_0$ with respects to width a and thickness b respectively yields $$\frac{\partial \omega_0}{\partial a} = \frac{3}{2}\sqrt{\frac{\beta abG}{JL}} + \frac{1}{2}\sqrt{\frac{a^3 bG}{JL\beta}}\frac{\partial \beta}{\partial a} - \frac{pL(3a^2b+b^3)}{24}\sqrt{\frac{\beta a^3 bG}{J^3 L}} \quad \text{(B-6)}$$

$$\frac{\partial \omega_0}{\partial b} = \frac{1}{2}\sqrt{\frac{\beta a^3 G}{JLb}} + \frac{1}{2}\sqrt{\frac{a^3 bG}{JL\beta}}\frac{\partial \beta}{\partial b} - \frac{pL(3b^2a+a^3)}{24}\sqrt{\frac{\beta a^3 bG}{J^3 L}} \quad \text{(B-7)}$$

where $$\frac{\partial \omega_0}{\partial a} \text{ and } \frac{\partial \omega_0}{\partial b}$$

represent the sensitivity of $\omega_0$ with respect to width a and thickness b respectively. And $$\frac{\partial B}{\partial a} = \frac{32}{\pi^4 a \cosh^2\left(\frac{\pi b}{2a}\right)} = \frac{64}{\pi^5 b}\tanh\left(\frac{\pi b}{2a}\right) \quad \text{(B-7-1)}$$

$$\frac{\partial B}{\partial b} = \frac{64}{\pi^5 b^2}\tanh\left(\frac{\pi b}{2a}\right) - \frac{32}{\pi^4 b \cosh^2\left(\frac{\pi b}{2a}\right)} \quad \text{(B-7-2)}$$

7.2 Lateral Beam Motion
7.2.1 Single Cantilever Beam

Figure 5B:
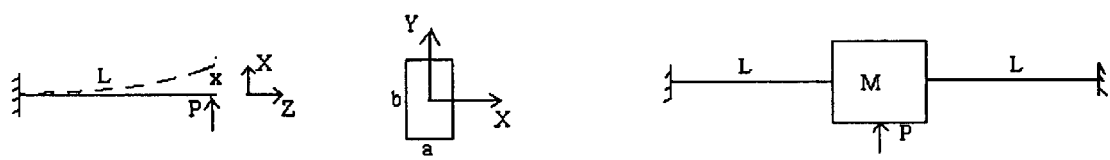

From Mechanics of Materials, the lateral displacement of a cantilever beam as shown in FIG. 5B can be expressed as $$x = \frac{Pz^2}{6EI}(3L-z) \quad \text{(B-8)}$$

where the P is the load at the end of the beam; L is the length of the beam; E is the modulus of elasticity; I is the moment of inertia on OY axis $$I = \frac{1}{12}ba^3 \quad \text{(B-9)}$$

The deflection at the end of the beam can be obtained from (B-8)

$$\delta = \frac{PL^3}{3EI} \quad \text{(B-10)}$$

Substituting (B-9) into (B-10), the elasticity of the beam is $$k = \frac{P}{\delta} = \frac{a^3 bE}{4L^3} \quad \text{(B-11)}$$

The natural frequency of the beam and moving mass system is $$\omega_0 = \sqrt{\frac{k}{M}} = \sqrt{\frac{a^3 bE}{4ML^3}} \quad \text{(B-12)}$$

where M is the mass of the system.

From (B-12), the sensitivity of natural frequency with respect to width a and thickness b can be obtained respectively as $$\frac{\partial \omega_0}{\partial a} = \frac{3}{4}\sqrt{\frac{abE}{ML^3}} \quad \text{(B-13)}$$

$$\frac{\partial \omega_0}{\partial b} = \frac{1}{4}\sqrt{\frac{a^3 E}{bML^3}} \quad \text{(B-14)}$$

7.2.2 Two Cantilever Beams

Figure 5C:
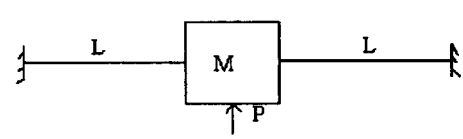

When two cantilevered beams suspend the laterally moving part as shown in FIG. 5C, each beam's transformation is different from that of only one cantilevered beam suspension. At the point the beam is connected to the moving part, there is no rotation but lateral displacement a shown in FIG. 5D.

At the end of the beam, there is not only the lateral motion force F, but also the torque T. The rotation and deflection caused by the Force F is $$\theta_1 = \frac{FL^2}{2EI} \text{ and } \delta_1 = \frac{FL^3}{3EI} \quad \text{(B-15)}$$

The rotation and displacement caused by the torque T is $$\theta_2 = \frac{TL}{EI} \text{ and } \delta_2 = \frac{TL^2}{2EI} \quad \text{(B-16)}$$

The boundary condition for the rotation can be expressed as $$\theta = \theta_1 + \theta_2 = 0 \quad \text{(B-17)}$$

Substituting (B-15) and (B-16) into (B-17) yields $$T = -\frac{FL}{2} \quad \text{(B-18)}$$

The total lateral displacement is $$\delta = \delta_1 + \delta_2 = \frac{FL^3}{3EI} + \frac{TL^2}{2EI} \quad \text{(B-19)}$$

Substituting (B-18) into (B-19) yields $$\delta = \frac{FL^3}{3EI} + \frac{TL^2}{2EI} = \frac{FL^3}{12EI} \quad \text{(B-20)}$$

For two beams, $F = P/2$, so that the deflection in term of P is $$\delta = \frac{PL^3}{24EI} \quad \text{(B-21)}$$

Compared (B-21) with (B-10), the elasticity of beam, the natural frequency and its sensitivity to width a and thickness b can be obtained as $$k = \frac{P}{\delta} = \frac{2a^3 bE}{L^3} \quad \text{(B-22)}$$

$$\omega_0 = \sqrt{\frac{k}{M}} = \sqrt{\frac{2a^3bE}{ML^3}} \qquad (B\text{-}23)$$

$$\frac{\partial \omega_0}{\partial a} = 3\sqrt{\frac{abE}{2ML^3}} \qquad (B\text{-}24)$$

$$\frac{\partial \omega_0}{\partial b} = \sqrt{\frac{a^3E}{2bML^3}} \qquad (B\text{-}25)$$

7.2.3 Folded Beams

Figure 5D:
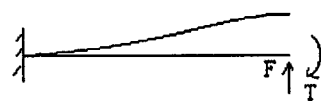
Figure 5E:
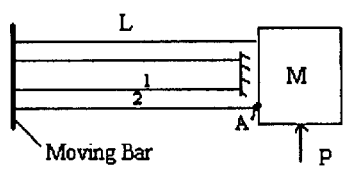

For the folded beam shown in FIG. 5E, because both the moving bar and moving mass can only move laterally the transformation of all four beams is just like that of beam shown in FIG. 5D. The upper two beams and lower two beams share the load P on the mass. The deflection on point A is the sum of deflections of beam-1 and beam-2

$$\delta = \delta^1 + \delta^2 = 2 \times \frac{FL^3}{12EI} = \frac{FL^3}{6EI} \qquad (B\text{-}26)$$

where F is the load on the point A, and F=P/2. Therefore, the total deflection in terms of P is $$\delta = \frac{PL^3}{12EI} \qquad (B\text{-}27)$$

The elasticity of beams the natural frequency and its sensitivity to width a and thickness b can be obtained as $$k = \frac{P}{\delta} = \frac{a^3bE}{L^3} \qquad (B\text{-}28)$$

$$\omega_0 = \sqrt{\frac{k}{M}} = \sqrt{\frac{a^3bE}{ML^3}} \qquad (B\text{-}29)$$

$$\frac{\partial \omega_0}{\partial a} = \frac{3}{2}\sqrt{\frac{abE}{ML^3}} \qquad (B\text{-}30)$$

$$\frac{\partial \omega_0}{\partial b} = \frac{1}{2}\sqrt{\frac{a^3E}{bML^3}} \qquad (B\text{-}31)$$

Comparing (B-27) with (B-20) shows that the deflection of folded beam on one side of mass is just like that of beam on one side of mass. If on the other side of the mass is there also a folded beam, the deflection of the mass will be same as that of two cantilevered beams. The elasticity of beams, the natural frequency and its sensitivity to width a and thickness b will also be same.

7.3 Appendix B References

The following references ate incorporated by reference herein:

1. J. L Synge and B. A. Griffith, "Principles of Mechanics", McGraw-Hill Book Company, 1942.
2. A. Higdog, et al, "Mechanics of Materials", John Wiley & Sons Inc., 1985.
3. F. E. Miller and H. A. Doeringsfeld, "Mechanics of Materials", Feld International Textbook Company.

What is claimed is:

1. A frequency robust resonator comprising:

at least one beam having a first end, a second end, and a beam width; and a proof mass having a proof mass area and a perimeter around the proof mass area;

wherein the proof mass is affixed to the first end of the beam and the second end of the beam is affixed to a ground and the proof mass perimeter multiplied by the beam width is substantially equivalent to six times the solid proof mass area; and wherein the at least one beam and the proof mass substantially have a same thickness, the thickness normal to the beam width and the solid proof mass area.

2. The resonator of claim 1, further comprising a second beam having a first and second end, wherein the first end of the second beam is affixed to the proof mass and the second end of the second beam is affixed to a ground.

3. The resonator of claim 2, wherein the first and second beam are affixed to opposite sides of the proof mass.

4. The resonator of claim 1, wherein the at least one beam is a folded beam including a moving bar.

5. The resonator of claim 1, wherein the resonator is a single material.

6. The resonator of claim 1, wherein the proof mass further comprises a comb-driven.

7. The resonator of claim 1, wherein proof mass is trussed.

8. The resonator of claim 7, wherein the proof mass further includes a width of the solid proof mass area, the width comprising M+2 row walls, where M is at least one.

9. The resonator of claim 7, wherein the proof mass further includes a length of the solid proof mass area, the length comprising N+2 row walls, where N is at least one.

10. The resonator of claim 1, wherein the resonator is multi-layered.

11. The resonator of claim 6, wherein the solid proof mass area includes an area of the comb drive.

12. The resonator of claim 7, wherein the trussed resonator includes inner trussed squares and the solid proof mass area comprises a total area of the inner trussed squares subtracted from an overall area of the proof mass.

13. The resonator of claim 10, wherein the trussed resonator includes inner trussed squares and the solid proof mass area include the area of each connector.

14. The resonator of claim 13, wherein the two material comprise an oxide layer and a metal layer over the oxide layer.

15. The resonator of claim 1, wherein each beam is affixed to the proof mass by a connector and the solid proof mass area include the area of each connector.

* * * * *

UNITED STATES PATENT AND TRADEMARK OFFICE
CERTIFICATE OF CORRECTION

PATENT NO. : 6,744,174 B2
DATED : June 1, 2004
INVENTOR(S) : Brad Paden et al.

It is certified that error appears in the above-identified patent and that said Letters Patent is hereby corrected as shown below:

Column 18,
Line 8, before second occurrence of "proof" insert -- solid --.
Line 29, "comb-driven" should read -- comb-drive --.
Line 30, before "proof" insert -- the --.
Line 48, after second occurrence of "the" delete "trussed resonator includes inner trussed squares and the solid proof mass area include the area of each connector" and insert -- multi-layered resonator is coated with two materials --.

Signed and Sealed this

Eighth Day of February, 2005

JON W. DUDAS
*Director of the United States Patent and Trademark Office*